United States Patent [19]

Motte et al.

[11] 4,306,170
[45] Dec. 15, 1981

[54] AT-CUT QUARTZ RESONATOR, WITH W/T=2.0 TO 2.8, L/T<25

[75] Inventors: Shunichi Motte; Naoyuki Echigo; Shiro Yamashita; Tsuneo Kuwabara; Kunihiro Takahashi, all of Tokyo, Japan

[73] Assignee: Kabushiki Kaisha Daini Seikosha, Tokyo, Japan

[21] Appl. No.: 69,932

[22] Filed: Aug. 27, 1979

[30] Foreign Application Priority Data

Sep. 6, 1978 [JP] Japan ................... 53/110169
Jan. 30, 1979 [JP] Japan ................... 54/9858

[51] Int. Cl.³ .............................. H01L 41/08
[52] U.S. Cl. ......................... 310/361; 310/368
[58] Field of Search ............... 310/361, 369, 368

[56] References Cited

U.S. PATENT DOCUMENTS 2,218,200 10/1940 Lack et al. ................ 310/361
3,143,672 8/1964 Mason ...................... 310/361
3,311,854 3/1967 Mason ................... 310/361 X
3,792,294 2/1974 Royer ....................... 310/361
4,071,786 1/1978 Yamashita ................. 310/361

FOREIGN PATENT DOCUMENTS 52-40089 3/1977 Japan ........................ 310/361

Primary Examiner—Mark O. Budd
Attorney, Agent, or Firm—Robert E. Burns; Emmanuel J. Lobato; Bruce L. Adams

[57] ABSTRACT

An AT-cut quartz resonator is disclosed, wherein the length l, the width w and the thickness t of the quartz crystal plate are respectively chosen in the directions of an electrical axis (X-axis), an optical axis (Z'-axis) and a mechanical axis (Y'-axis), the width-to-thickness ratio w/t is chosen in the range of 2.0 to 2.8 and the length-to-thickness ratio l/t is chosen less than 25. Consequently, an AT-cut quartz resonator of miniature size having high Q-values of the major mode and excellent frequency-temperature characteristics of the vibration frequency is realized.

9 Claims, 23 Drawing Figures

F I G. 18
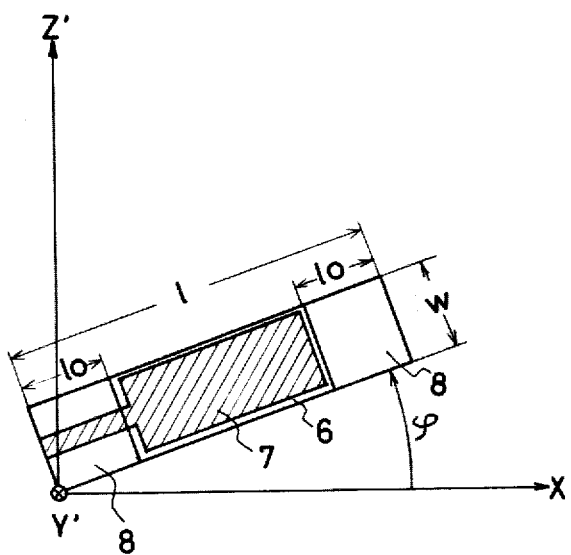

AT-CUT QUARTZ RESONATOR, WITH W/T=2.0 TO 2.8, L/T<25

BACKGROUND OF THE INVENTION

The present invention relates to an AT-cut quartz resonator, and more particularly to a thin and miniature AT-cut quartz resonator having excellent frequency-temperature characteristics of the vibration frequency, and high Q-values in which the vibration frequency of spurious vibration is sufficiently distant from that of the major thickness-shear vibration mode.

Conventionally, AT cut quartz resonators have been in popular use in telecommunication instruments or the like on account of their temperature characteristics, high Q-values and low equivalent series resistance.

The AT-cut quartz resonators which have been conventionally used have usually been disk shaped. The miniaturization of the AT-cut quartz resonators has been restricted since there are strong couplings between the major thickness-shear vibration and spurious vibrations, unless the dimensional ratio of the diameter to the thickness has been large, and the Q-values and the frequency-temperature characteristics of these quartz resonators are very poor.

On the other hand, a rectangular AT-cut resonator has been proposed since it is advantageous for miniaturization. According to the Japanese Opened Pat. Nos. 100991/74 and 97394/76, the length-to-thickness ratio l/t of a quartz crystal plate should be more than 30. In case the major surfaces (X–Z' planes) and the side surfaces (X–Y' planes) of the quartz crystal plate meet substantially at right angles, the temperature of the inflection point of the frequency-temperature curve becomes gradually higher than that of the AT-cut quartz resonator of an infinite plate, if the width-to-thickness ratio w/t of the quartz crystal plate becomes less than eight. When w/t is three, the temperature of the inflection point is substantially 40°, consequently the quartz crystal plate is not suitable for use at room temperature. An AT-cut quartz resonator having a cubic temperature curve having the temperature of the inflection point at room temperature, preferably at 20° C., is suitable for use in a wrist watch and a portable electronic device, though such has not been invented yet.

Accordingly, it is an object of the present invention to provide a new AT-cut quartz resonator of sufficiently miniature size to be incorporated into a wrist watch, and of high Q-values and of low equivalent series resistance and having the temperature of the inflection point of the frequency-temperature curve near 20° C. for practical use, and further having the spurious vibration frequencies differ from the major thickness-shear vibration frequency and for which mass production and accurate finishing is permitted.

BRIEF DESCRIPTION OF THE DRAWINGS

FIG. 18 shows the rotation angle when the Y'-axis is the rotation axis.

DETAILED DESCRIPTION OF THE INVENTION

Figure 1:
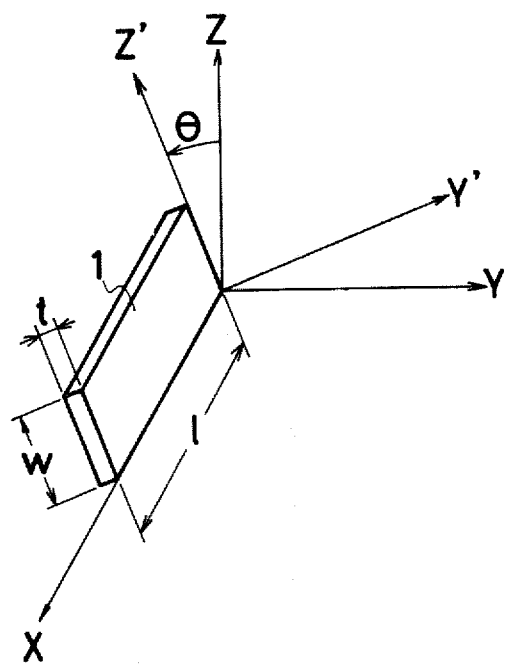
FIG. 1 shows crystallographic axes of a rectangular AT-cut quartz resonator according to the present invention.

Hereafter the present invention will be illustrated in conjunction with the embodiments shown in the drawings. Though the following embodiments illustrate the case of a right-hand crystal using the right-hand rectangular coordinate system, it is to be noted that in the case of the left-hand crystal, the coordinate system is replaced by the left-hand coordinate axis and the corresponding parts are replaced by the left-hand AT-cut crystal.

A thin shape denotes the X–Z' planes of a quartz crystal plate being thin along the X-axis so as to be almost rectangular in plan, including a round cornered rectangular shape and somewhat a barrel shape according to the present invention.

FIG. 1. shows the crystallographic axes of a thin AT-cut quartz resonator, e.g., a rectangular AT-cut quartz resonator according to the present invention. Numeral 1 is a quartz crystal plate. The quartz crystal plate 1 has been rotated counter-clockwise by the cut angle $\theta$ (33°20' to 36°20') around the X-axis directed perpendicular to the paper and upwardly so as to have new axes X, Y' and Z', the overall length l, the overall width w and the maximum thickness t of the quartz crystal plate 1 being respectively along the X-axis, the Z'-axis and the Y'-axis. The quartz crystal plate 1 is formed into a rectangular AT-cut quartz resonator by providing a metalic film on both major surfaces of the plate 1 by evaporation or by sputtering.

Figure 2:
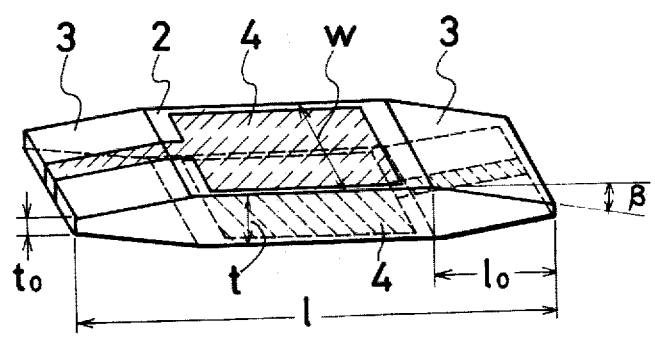
FIG. 2 is a perspective view of a rectangular AT-cut quartz resonator embodying the present invention.

FIG. 2 is a perspective view of a rectangular AT-cut quartz resonator embodying the present invention. Numeral 2 is a quartz crystal plate and both end portions 3 at the opposite longitudinal ends of the quartz crystal plate 2 are bevelled. Symbols l, w, B, $l_0$ to $t_0$ respectively denote the length, the width, the bevel angle, the bevel length and the thickness of the ends of the bevelled portions. The thickness t is the typical value of the thickness of the quartz crystal plate provided with electrodes so as to drive the thickness-shear vibration mode.

The reason why both the end portions 3 are so finished as to have a bevelled shape is to weaken spurious vibrations and to prevent deterioration of the Q-value when the quartz crystal plate is supported by concentrating the energy of the thickness shear vibration on the center of the surface of the quartz crystal plate. Both end portions of the quartz crystal plate 2 can be so finished as to have a convex shape, i.e., the thickness of the end portions of the quartz crystal plate can be thinner than that of the major vibrating portion. And also the end portions of the quartz resonator 2 can be so finished as to have a plano-bevel shape of a convex shape.

The rectangular AT-cut quartz resonator, for example, is completed by the step of providing electrodes 4, 4 evaporated or sputtered on both the X-Z' planes of the quartz crystal plate 2, and the step of supporting the end portions of the quartz crystal plate 2 by lead wires, and the step of housing it in a capsule.

Though the thickness-shear vibration is the major vibration of the AT-cut quartz resonator, a number of spurious vibrations such as the contour vibration also exist. In order to improve the Q-value and the frequency-temperature characteristic of the major thickness-shear vibration, the injurious effect of the spurious vibrations should be avoided. Therefore, it is necessary to find the dimensional ratios that the spurious vibrations of high and low responses sufficiently different from the major thickness-shear vibration. Consequently it is first necessary to grasp the spurious vibrations of high response which strongly effects the width dimension, i.e., width-shear vibration. The vibration frequency of the width-shear vibration is given by $f=(n/2w)\sqrt{C'55/\rho}$, where n is an order of overtones, $\rho$ is the density of quartz, and $C'55$ is an elastic constant of the XY'Z' rectangular coordinate axis. When the vibration frequency f of the width-shear vibration coincides with the vibration frequency of the thickness-shear vibration f, w/t of a thin AT-cut quartz resonator is calculated as 1.5 n. Though the width-shear vibration has been regarded to appear only when n is the odd number, according to our embodiment, the width-shear vibration appears when n=2, i.e., w/t=3 and couples with the thickness-shear vibration. Namely, the width-shear vibration of the even number also effects injuriously on the frequency-temperature characteristic of the thickness-shear vibration and also deteriorates the Q-value.

Figure 3:
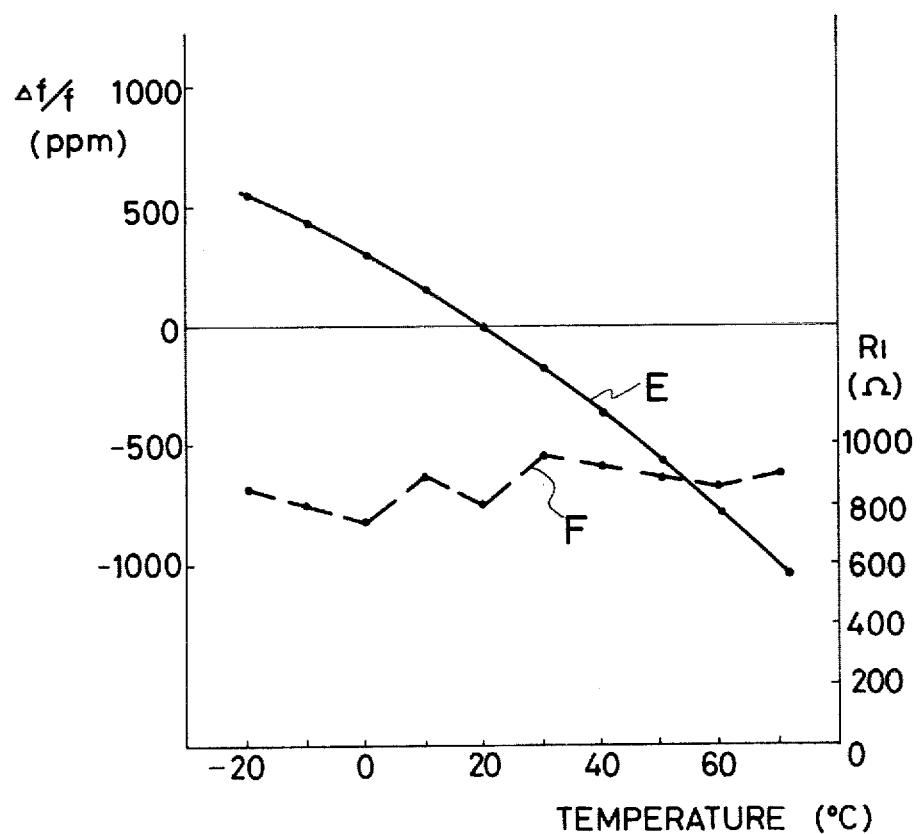
FIG. 3 shows an embodiment of the temperature-curves when the width-to-thickness ratio w/t is 2.94.

FIG. 3 shows the temperature characteristics of the thickness-shear vibration when w/t shown in FIG. 2 is substantially 2.94. E denotes the frequency-temperature curve showing the negative temperature characteristic of sharp slope strongly influenced by the width-shear vibration.

In the case of the AT-cut quartz resonator, the frequency-temperature characteristics can be adjusted by changing the cut angle $\theta$.

By this width-to-thickness ratio w/t, however, even if the cut angle $\theta$ is changed, it is difficult to realize the plain cubic frequency-temperature curve at room temperature since the thickness-shear vibration tightly couples with the width-shear vibration.

In FIG. 3, F denotes the temperature characteristic of the equivalent series resistance R1, in which there is shown a decline of Q value caused by large resistance influenced by the width-shear vibration.

Accordingly the frequency-temperature characteristic of the thickness-shear vibration when the width-to-thickness ratio w/t varies in the range of 3.0 to 1.5 is investigated.

The temperature of the inflection point denotes the temperature where the second differential of the cubic curve is 0, in case the frequency-temperature characteristics are represented by a cubic curve.

Figure 4:
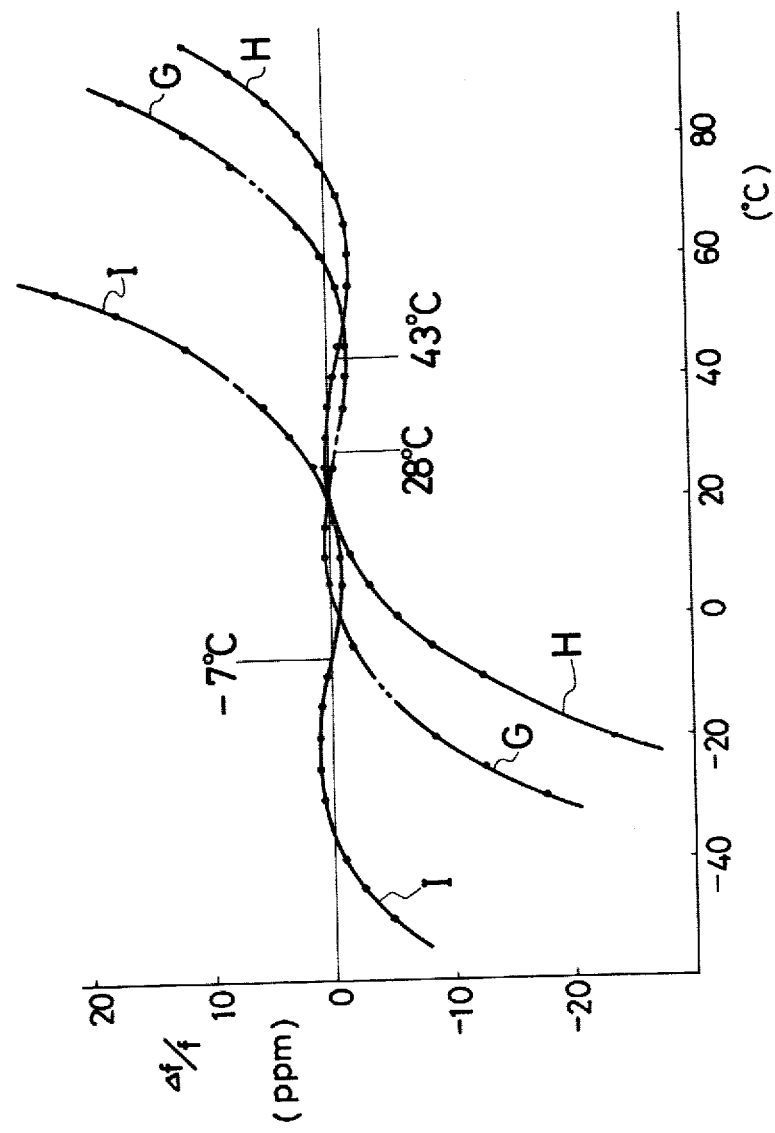
FIG. 4 shows an embodiment of the frequency-temperature curves when the width-to-thickness ratio w/t is less than 3.

FIG. 4 shows the frequency-temperature curves of the thickness-shear vibration, whose abscissa is temperature and whose ordinate is the frequency variation ratio where the reference temperature is 20° C. A curve G is a frequency-temperature curve by theoretical calculation of an infinite plate AT-cut quartz resonator (Masanao Ariga: "The Elastic Constants of Quartz and their Temperature Characteristic" Bullentin of the Tokyo Institute of Technology, Series A Number 2, 1956 (in Japanese)), where the temperature of the inflection point is about 28° C. A curve H is a frequency-temperature curve when the width-to-thickness ratio w/t thereof is about 2.87, where the temperature of the inflection point is about 43° C. A curve I is a frequency-temperature curve when the width-to-thickness ratio w/t thereof is about 1.94, where the temperature of the inflection point is about $-7°$ C.

Figure 5:
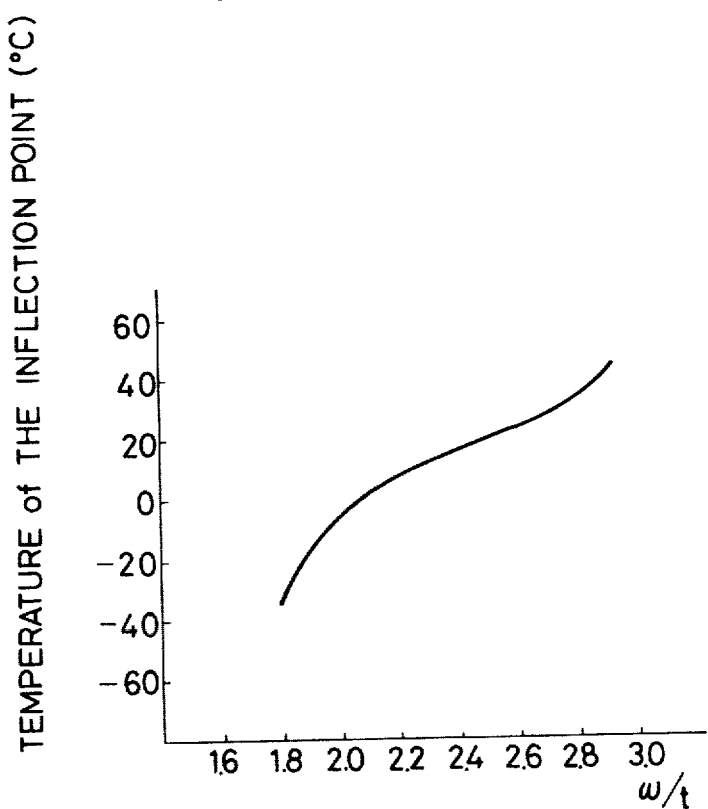
FIG. 5 is a correlation diagram between the temperature of the inflection point and the width-to-thickness ratio w/t of an AT-cut quartz resonator according to the present invention.

FIG. 5 shows the correlation between the temperature of the inflection point at zero temperature coefficient and the width-to-thickness ratio w/t investigating the frequency-temperature curves shown in FIG. 4.

As shown in FIG. 5, the temperature of the inflection point correlates to the width-to-thickness ratio w/t, whose abscissa is the width-to-thickness ratio w/t and whose ordinate is the temperature of the inflection point.

As understood from FIG. 5, when the width-to-thickness ratio w/t is in the range of 1.5 to 3.0 where w/t meets the primary and secondary width-shear vibrations, the temperature of the inflection point changes from low to high and moreover temperature values of the inflection point which have never been realized conventionally are obtained.

In order to put the AT-cut quartz resonator having a good frequency-temperature curve into practical use in telecommunication instruments or electronic wrist watches, the temperature of the inflection point should be in the range of 35° C. to 5° C., and thereby an excellent frequency-temperature characteristics are obtained at room temperature.

Figure 6:
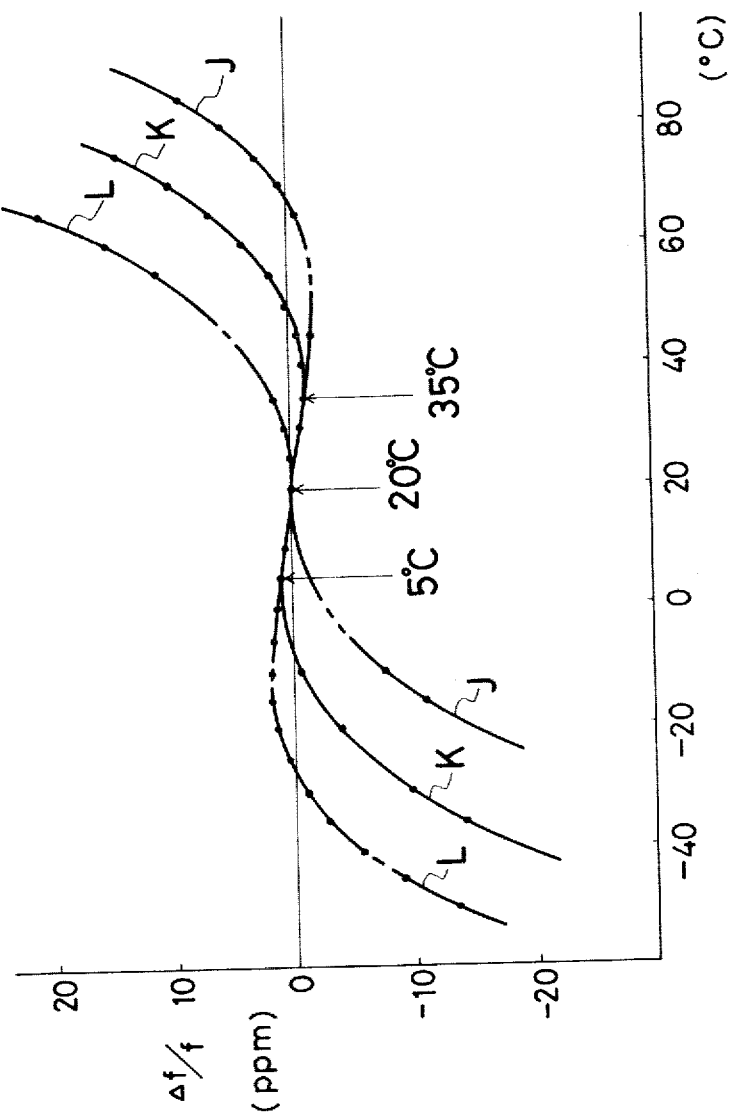
FIG. 6 shows an embodiment of the frequency-temperature curves of an AT-cut quartz resonator.

FIG. 6 shows the variation of the temperature of the inflection point according to the present invention, where J, K and L show frequency-temperature curves when the temperature of the respective inflection points are respectively 35° C., 20° C. and 5° C. As shown by the curves, the frequency change in the temperature range of 0° C. to 40° C. are in the range of 3 ppm, which is a sufficiently good frequency-temperature characteristic for practical use in a high precision wrist watch. Particularly it is preferable that the temperature of the inflection point is near 20° C. for practical use.

Th width-to-thickness ratio w/t which satisfies the temperature of the inflection point in the range of 35° C. to 5° C. is estimated as in the range of 2.0 to 2.8 in FIG. 5. The thin AT-cut quartz resonator having excellent frequency-temperature characteristics as shown by FIG. 6 can be obtained when the width-to-thickness ratio w/t is in the range of 2.0 to 2.8. On the other hand, as understood from FIG. 5, the dispersion in the temperature of the inflection point is small even if the width-to-thickness ratio w/t varies to some extent in the range of 2.0 to 2.8, thereby the dispersion to this extent does not injure mass-productivity of the quartz resonator As for the dimensional ratios besides that of the present invention, when the width-to-thickness ratio w/t is more than 2.8, the temperature of the inflection point rapidly goes up, while when the width-to-thickness ratio w/t is less than 2.0, the temperature of the inflection point rapidly falls. Thus the temperature of the inflection point is far from the room temperature, moreover, the temperature of the inflection point varies by a little change in the width-to-thickness ratio w/t, whereby the yield of manufacture of the quartz resonator when mass produced considerably decreases.

On the other hand, the width-to-thickness ratio according to the present invention is suitable for mass production and the temperature of the inflection point can be arbitrary chosen in the range of 5° C. to 35° C. according to the conditions under which the resonator is used.

Subsequently the length-to-thickness ratio should be determined. According to the Japanese Opened Pat. No. 100991/74, if the length-to-thickness ratio l/t is less than 30, the quartz resonator is hard to be used in practical.

However, the resonator housed in a limited space such as an electronic wrist watch is required to be small sized. For instance when l/t is 30, the length of the AT-cut quartz resonator of 4 MHz is about 12 mm. On the other hand when the oscillation frequency becomes higher, the current consumption in the oscillating circuit and frequency dividing circuit increases generally, and thereby it is not suitable for use in portable devices. Therefore l/t of the resonator is preferable less than 25 and the smaller l/t is, the more the resonator is suitable for use in portable wrist watches.

Figure 15:
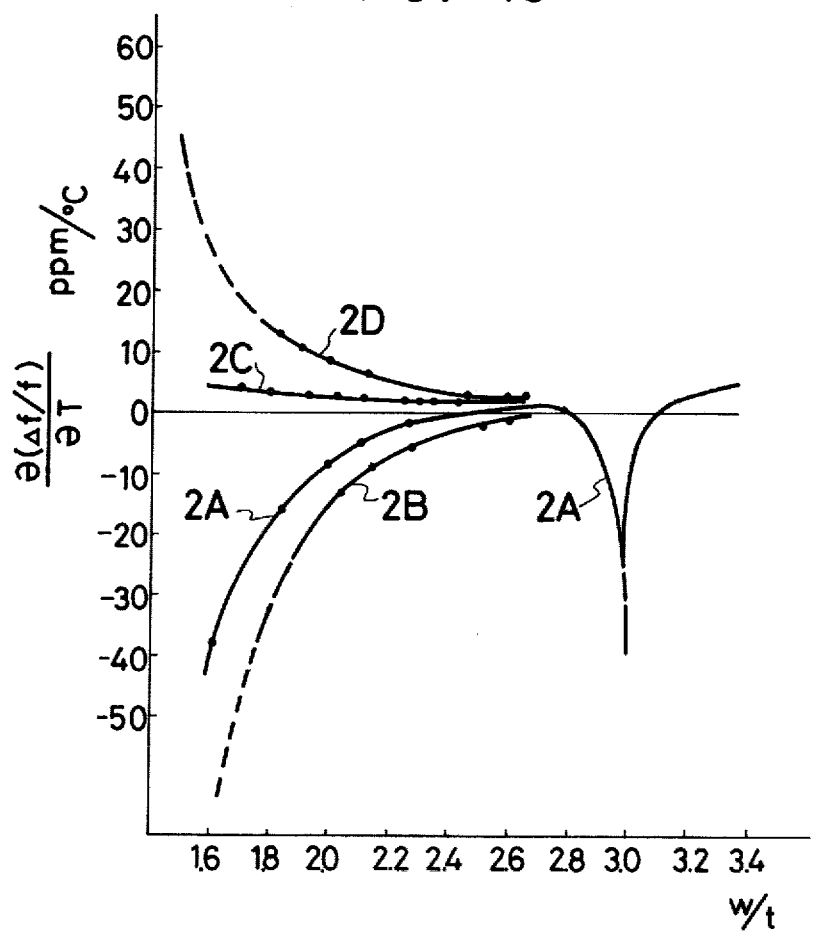
FIG. 15 is a correlation diagram between the slope of the frequency-temperature curves at room temperature and the width-to-thickness ratio w/t of a rectangular AT-cut quartz resonator.

Now, in order to realize the resonator for practical use in wrist watches, the frequency-temperature characteristics of the resonator is measured choosing the length-to-thickness ratio l/t in the range of 25 to 7 when w/t is in the range of 2.0 to 2.8, and the temperature of the inflection point and the slope of the frequency-temperature curve at room temperature is investigated. As a result, the correlation diagram showing essentially the same curves as the curves shown in FIGS. 5 and 15 is obtained at a plurality of values of l/t. And a thin AT-cut quartz crystal resonator of high Q-values and low equivalent resistance practicable for use in an electronic wrist watch is obtained. Investigating the range of l/t=25 to 7 more in detail, the vibration characteristics of the resonator are effected by the spurious vibrations naturally. A part of the experimental results will be shown in FIG. 7.

Figure 7:
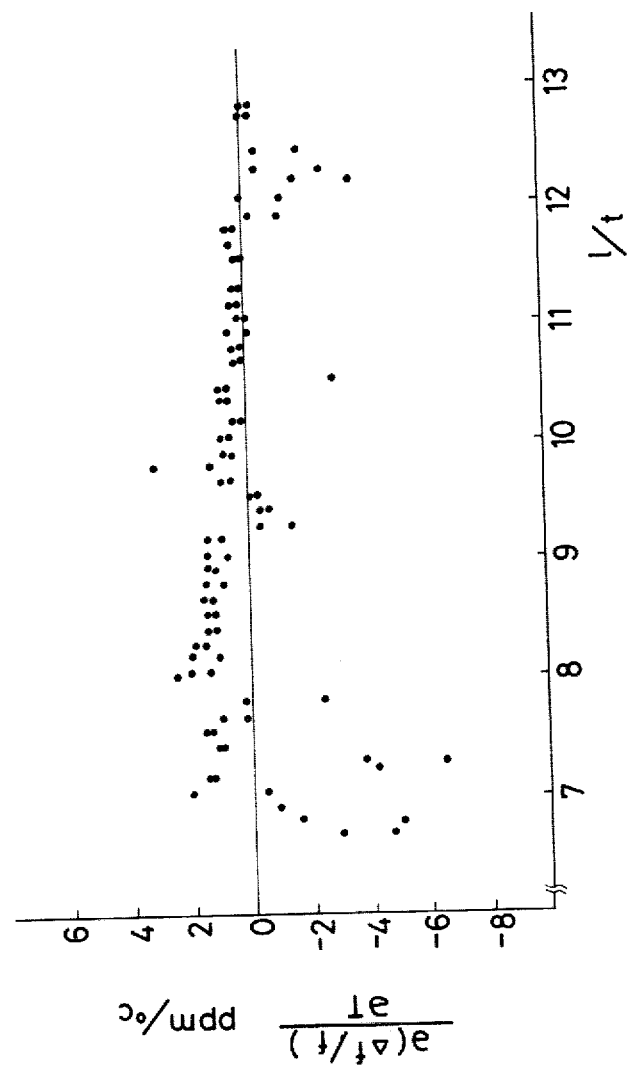
FIG. 7 is a correlation diagram between a slope of the frequency-temperature curve at room temperature and the length-to-thickness ratio l/t of a rectangular AT-cut quartz resonator according to the present invention.

FIG. 7 shows a correlation diagram between the slope of the frequency-temperature curves at room temperature and the length-to-thickness ratio l/t, whose abscissa is the length-to-thickness ratio l/t and whose ordinate is the slope $\partial(\Delta f/f)/\partial t$ of the frequency-temperature curve at room temperature. The correlation diagram show the data of the rectangular AT-cut quartz crystal resonator when the width-to-thickness ratio w/t=2.5 and length-to-thickness ratio l/t=12.9 to 6.7. Investigating the correlation diagram carefully, in the range the length-to-thickness ratio l/t is sufficiently small, some ratios of l/t give rise to stable slopes of the frequency-temperature curve, the variation of which that are caused by dispersion of l/t is very small. By the correlation diagram in FIG. 9 some ratio values of l/t of resonators suitable for practical use are found when the length-to-thickness ratio l/t is in the range of 12.9 to 6.7.

Figure 8:
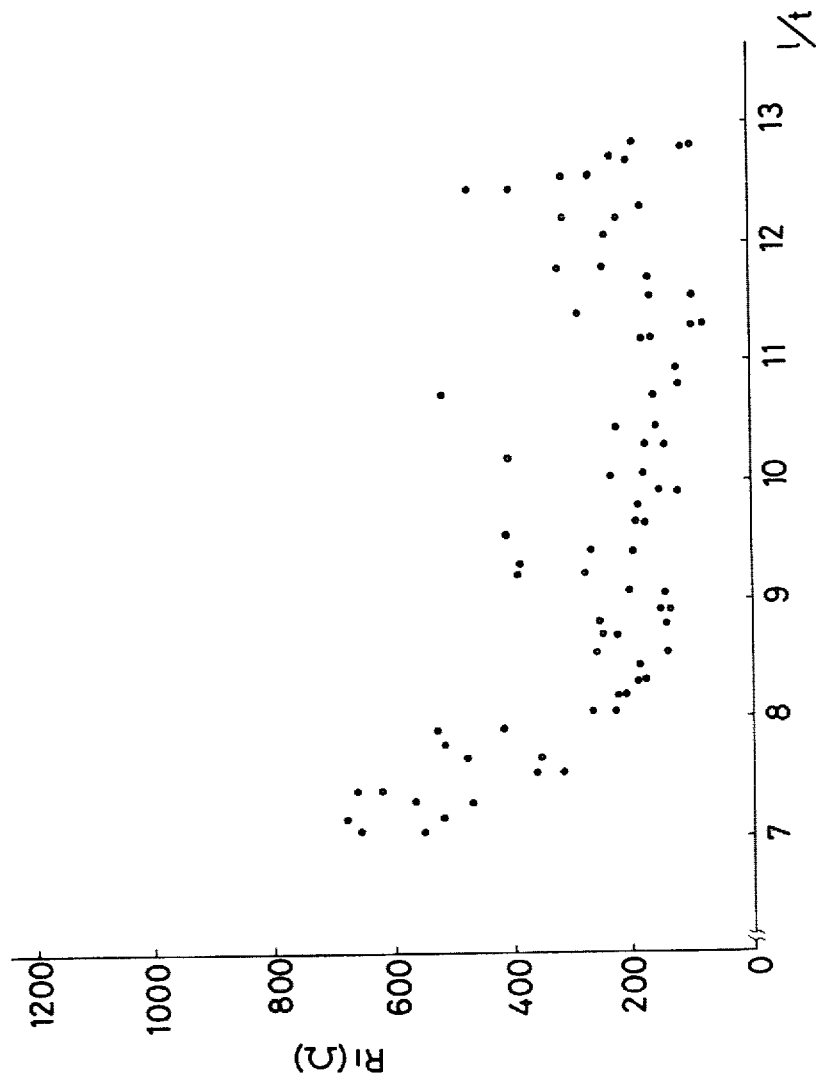
FIG. 8 is a correlation diagram between the equivalent series resistance at room temperature and the length-to-thickness ratio l/t of a rectangular AT-cut quartz resonator embodying the present invention.

FIG. 8 is the correlation diagram between the equivalent series resistance $R_1$ and the length-to-thickness ratio l/t of the rectangular AT-cut quartz resonator having a bevelled shape in the same way as FIG. 7. The data evidently shows a plurality of the length-to-thickness ratios of resonators suitable for practical use.

Figure 9:
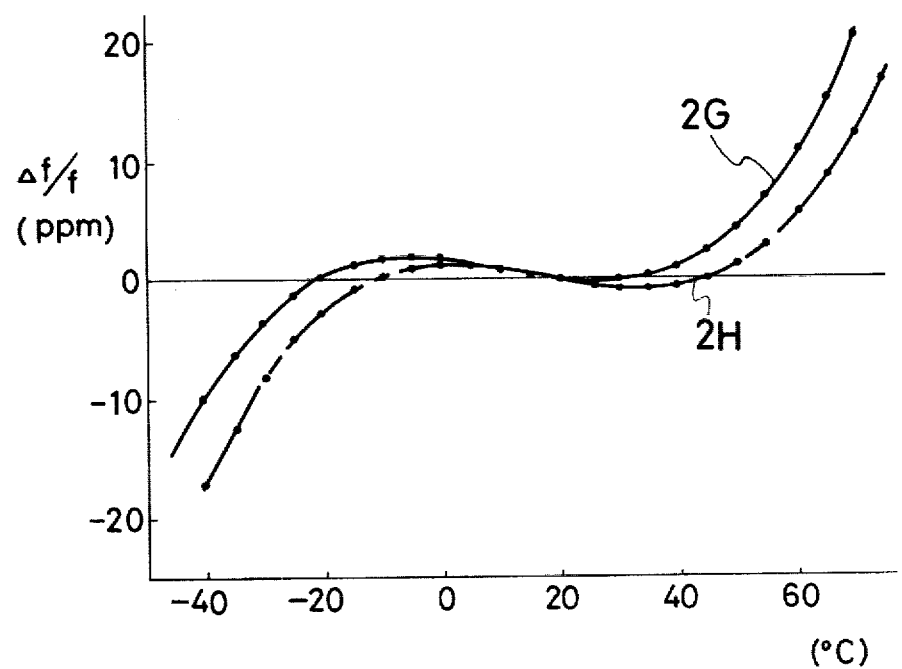
FIGS. 9 and 10 show frequency-temperature curves embodying the present invention.
Figure 10:
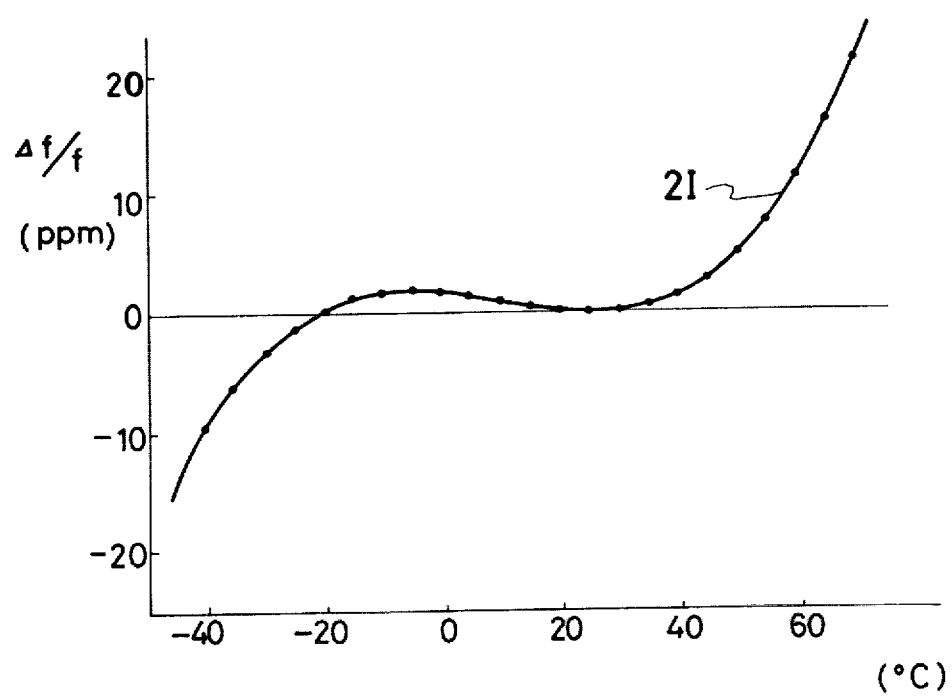

FIG. 9 and FIG. 10 show the frequency-temperature curves of the embodiments according to the present invention. In FIG. 9, 2G is the frequency-temperature curve when the frequency is 4.2 MHz, w/t is approximately 2.3 (width $w \approx 0.9$ mm, thickness $t \approx 0.4$ mm), l/t is approximately 8.5 (length $l \approx 3.4$ mm, thickness $t \approx 0.4$ mm), bevel angle $\beta$ is approximately 7°13' and bevel length 0 is approximately 1 mm, and thereby the temperature of the inflection point substantially at 10° C. and the equivalent series resistance $R_1$ substantially at 138 Ω are obtained.

While 2H is the frequency-temperature curve when the frequency is 4.2 MHz, w/t is approximately 2.5 (width $w \approx 1.0$ mm, thickness $t \approx 0.4$ mm), l/t is approximately 8.5 (length $l \approx 3.4$ mm, thickness $t \approx 0.4$ mm), bevel angle $\beta$ is approximately 7°13' and bevel length $l_0$ is approximately 1 mm, and thereby the temperature of the inflection point substantially at 18° C. and the equivalent series resistance $R_1$ substantially at 130 Ω are obtained.

In FIG. 10, 2I is the frequency-temperature curve when the frequency is 4.2 MHz, w/t is approximately 2.3 (width $w \approx 0.9$ mm, thickness $t \approx 0.4$ mm), l/t=9.3 (length $l \approx 3.7$ mm, thickness $t \approx 0.4$ mm), bevel angle $\beta$ is approximately 7°13' and bevel length $l_0$ is approximately 1 mm, and thereby the temperature of the inflection point substantially at 10° C. and the equivalent series resistance $R_1$ substantially at 130 Ω are obtained.

In the above mentioned embodiments, the vibration characteristic of the rectangular AT-cut quartz resonator having a bevelled shape is investigated by the step of disposing Cr and/or Au thereon by vacuum evaporation as electrodes shown in FIG. 2, supporting both ends of the quartz crystal plate in the length direction and holding the quartz crystal plate in a vacuum capsule. The frequency-temperature curves as shown in FIGS. 9 and 10 are obtained at a plurality of values in the range of the width-to-thickness ratio w/t according to the present invention except at values where performance is injuriously effected by spurious resonances. The typical Q-value of the resonators for use in wrist watches is about 180,000 when the width-to-thickness ratio w/t is in the range of 2.0 to 2.8 and the length-to-thickness ratio l/t is less than 25, e.g., in the range of 25 to 7, and a Q-value of about 350,000 can also be obtained. While the equivalent series resistance $R_1$ of the resonator according to the present invention is also small.

Subsequently, an embodiment of the rectangular AT-cut quartz crystal resonator having the vibration frequency of the major thickness shear vibration sufficiently distant from that of the spurious vibrations and high Q-values will be illustrated by further restricting the values of w/t and l/t.

When the length l is determined a strong spurious vibration along the length, which is the spurious vibration of high response, the frequency of which is determined by the length dimension, should differ substantially from the vibration frequency of the major thickness-shear vibration.

The vibration frequency f of the flexural resonance is given by $$f = \frac{n}{2l}\sqrt{23\frac{\tanh(nt/l)}{\rho}}$$

where n is an order of overtones (an even number) and $\rho$ is the density of quartz. In the case of the rectangular AT-cut quartz resonator, though l/t less than 25 is preferable for use in electronic wrist watches, if l/t is too small, the Q-value deteriorates, so it is preferable that l/t is in the range of n=18 and n=20 in the present embodiment.

The flexural vibration frequency coincides with the major vibration frequency when n=18 and n=20 and the length-to-thickness ratio l/t when n=18 and n=20 are calculated as 14.5 and 16.2 and the central value thereof is selected. Namely the injurious effect of spurious vibration is avoided when l/t is the central value of 14.5 and 16.2. The thickness-shear vibration is not influenced by the injurious effect of the spurious vibrations of high response such as the width-shear vibration and the thickness-shear vibration when the width-to-thickness ratio w/t of the quartz crystal plate is 2.5 and the length-to-thickness ratio l/t thereof is the central value of 14.5 and 16.2.

However, there are many spurious vibrations of low response other than the width-shear vibration and the flexural vibration.

Figure 11:
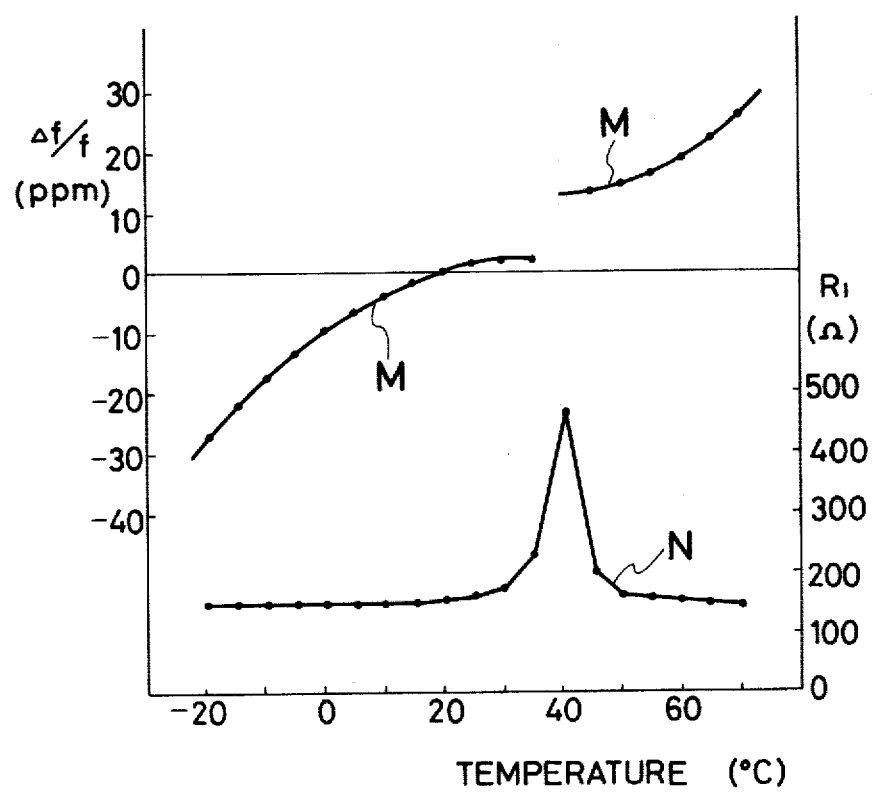
FIG. 11 shows the temperature curve of the rectangular AT-cut quartz resonator when the spurious vibration frequency of low response is in the vicinity of the major vibration frequency.

FIG. 11 shows the temperature curves of the rectangular AT-cut quartz resonator when spurious vibration frequency is near the major thickness-shear vibration.

Curves M and N respectively denote the frequency-temperature curve and the temperature curve of the equivalent series resistance $R_1$.

The discontinuity in the frequency-temperature curve is generated when the major thickness-shear vibration crosses the spurious vibration frequency of low response by the temperature change.

The rectangular AT-cut quartz resonator having such characteristic is not preferable for practical use. The spurious vibration frequency of low response should also be distant from the major thickness-shear vibration in order to improve the Q-value and frequency-temperature characteristic of the rectangular AT-cut quartz resonator. Therefore, w/t and l/t of the quartz crystal plate 2 according to the present invention chosen respectively as w/t=2.5 and l/t=15.25 as shown in FIG. 2 are changed fractionally in order to investigate the spurious vibration of low response of the rectangular AT-cut quartz resonator each time.

Figure 12:
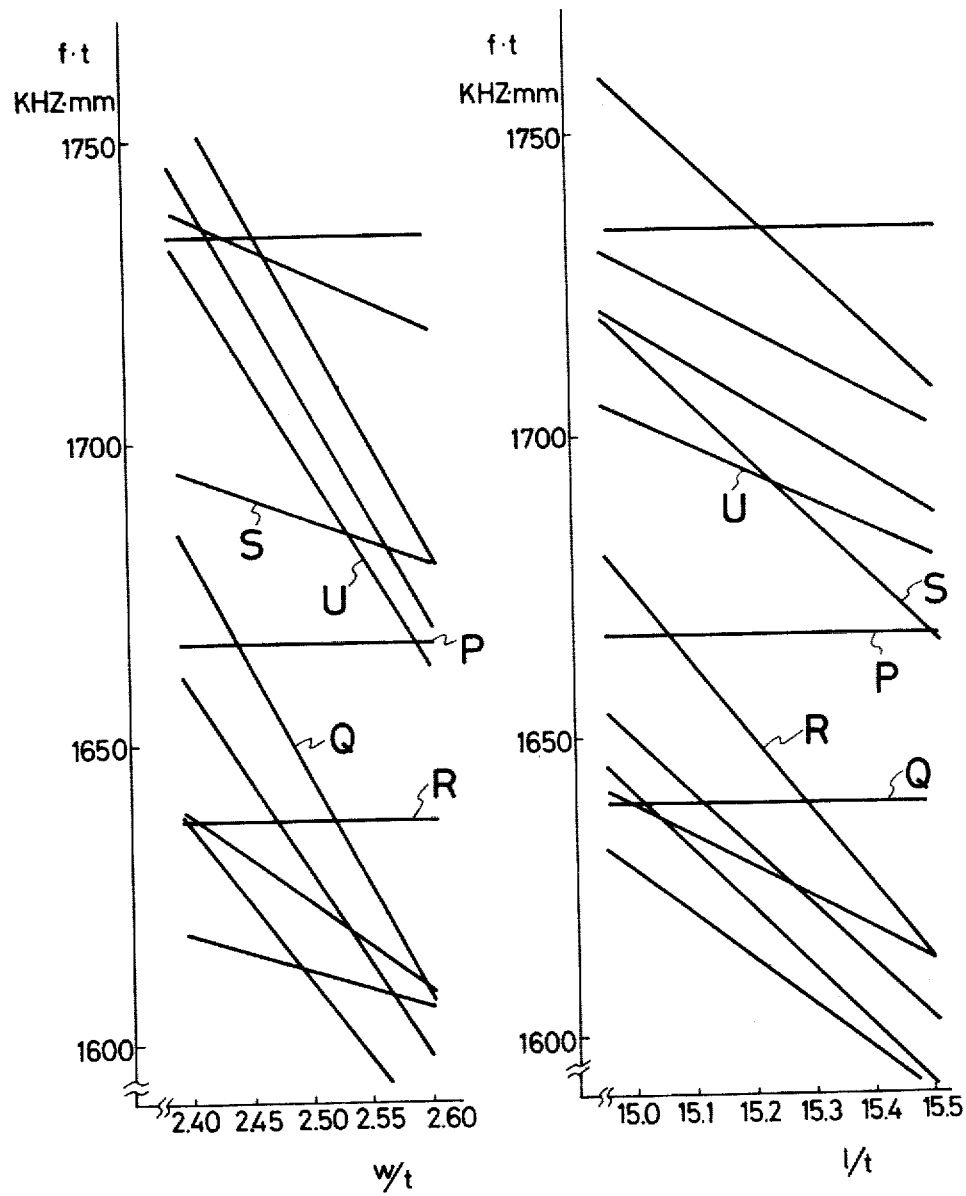
FIG. 12(a) and 12(b) are mode charts.

FIGS. 12(a) and 12(b) are respectively mode charts showing the variations of frequency responses when the width w and the length are changed, whose straight lines denote actually measured values and whose ordinate denotes the frequency constant f.t. A straight line P shown in FIGS. 12(a) and 12(b) is the main thickness-shear vibration and the frequency constant of which is about 1666.5 KHz.mm. Straight lines other than the straight line P are spurious vibrations and though the vibration mode thereof are indistinct, the slope of the frequency constants against w/t and l/t are experimentally obtained.

The slope of these straight lines are almost straight in the range of the minimum region. The spurious vibrations to be taken note of when w/t and l/t are determined are straight lines Q, R, S and U. Here the spurious vibration frequencies shown by the straight lines Q, R, S and U are respectively fQ, fr, fs and fU.

The frequency constants of the four spurious vibrations are shown by functions of w/t and l/t as follows.

A straight line Q:

fQ·t = 366 w/t + 2559.6

A straight line R:

fR·t = 123 l/t + 3519.5

A straight line S:

fS·t = −72.0 w/t − 94.5 l/t + 3313.06

A straight line U:

fU·t = −322.0 w/t − 46.0 l/t + 32.03.4

In order to avoid the thickness-shear vibration P injuriously effected by the four spurious vibrations, the following equations should be satisfied when the frequency constant of the major vibration is fP·t, where fP is the major vibration frequency.

$$fP.t \geq fQ.t \qquad fP.t \geq fR.t$$
$$fP.t \leq fS.t \qquad fP.t \leq fU.t$$

The frequency of the thickness-shear vibration P can be adjusted by the thickness of the electrode. Since the rate of frequency deterioration caused by the thickness of electrode is larger than that of the spurious vibration, the frequency constant can be changed to the extent of ±10 KHz.mm. Accordingly the above equations can be represented as follows:

$$fP.t + 10 \geq fQ.t \qquad fP.t + 10 \geq fR.t$$
$$fT.t - 10 \leq fS.t \qquad fP.t - 10 \leq fU.t$$

Accordingly, 1676.5 ≥ 366 w/t + 2559.6

1676.5 ≥ 123 l/t + 3519.5

$1656.1 \geq 72.02 \, l/t - 94.5 \, l/t + 3313.06$ $1656.5 \geq 322.0 \, w/t - 46.0 \, l/t + 3203.4$ When w/t and l/t of the rectangular AT-cut quartz resonator satisfy the above four equations, the strong spurious vibrations such as the width-shear vibration and the flexural vibration can be eliminated and at the same time, as shown in FIGS. 12(a) and 12(b), the major vibration frequencies can be different from the weak spurious vibration frequencies.

Figure 13:
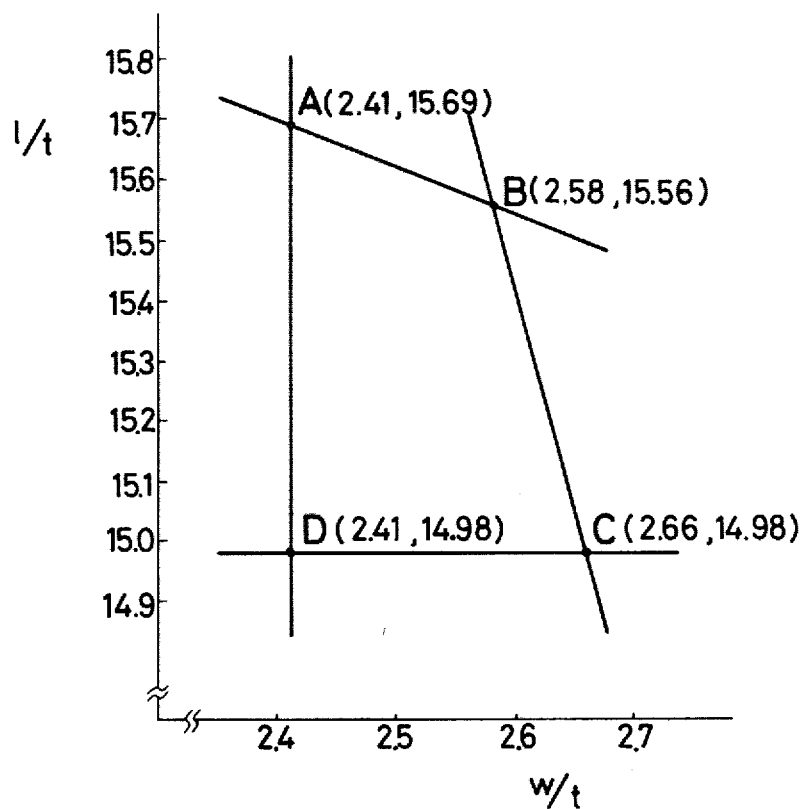
FIG. 13 shows the dimensional region embodying the present invention.

FIG. 13 shows the dimensional ratios w/t, l/t which satisfy the above four equations embodying the present invention, whose abscissa is w/t and whose ordinate is l/t. If the coordinates of points on this graph respectively indicate w/t and l/t, A, B, C and D are respectively (2.41, 15.69), (2.58, 15.56), (2.66, 14.98) and (2.41, 14.98). The region inside the quadrangle composed of the above points A, B, C and D satisifies the rectangular AT-cut quartz resonator embodying the present invention also differs from the weak spurious vibrations.

Figure 14:
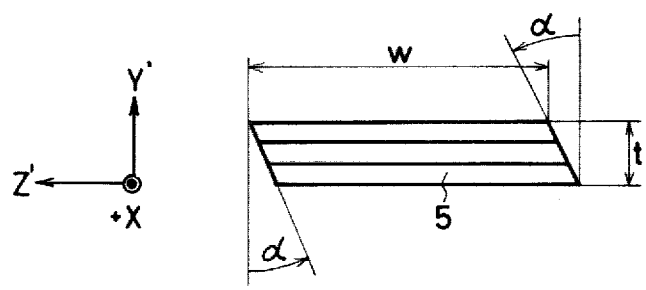
FIG. 14 is a side view showing Y'–Z' planes of a quartz crystal plate tilting the side surfaces thereof.

FIG. 14 shows a quartz crystal plate 5 according to the present invention showing the X-Y' planes, which are the side surfaces of the quartz crystal plate 2, are tilted counterclockwise by $\alpha$ (about 5 degrees) around the X-axis directed perpendicular to the paper and upwardly.

According to the Japanese Opened Patent Publications cited before, the side surfaces of the quartz crystal plate are tilted in order to make the frequency-temperature characteristic of the quartz resonator equivalent to that of an infinite plate since when the width-to-thickness ratio w/t is in the range of 1 to 8, the temperature of the inflection point of the frequency-temperature curve is almost equal to that of the theoretical value (about 25° C.) of the infinit plate. However, even when the resonator according to the present invention is tilted by $\alpha$ (about 6°27'), the temperature of the inflection point of the frequency-temperature curve is the same as the curve shown in FIG. 5.

When the width w and the length l of the rectangular AT-cut quartz resonator tilting the side surfaces thereof is changed fractionally in the minimum range to thereby investigate the strength of the frequency responses in each cases, the frequency response is almost the same as the quartz resonator the side surfaces of which are not tilted as shown in FIG. 12(a) and 12(b). At this time the width dimension w of the rectangular AT-cut quartz resonator the side surface of which are tilted is the upper or lower plane of the X-Z' plane as shown in FIG. 14.

Thus, by selecting the length l and the width w of the rectangular AT-cut quartz resonator tilting the side surfaces thereof in the region of the quadrangle ABCD as shown in FIG. 13, the rectangular AT-cut quartz resonator embodying the present invention which further restrict w/t and l/t, not influenced by the spurious vibrations regardless of the strength of responses is realized.

FIG. 15 is the correlation between the width-to-thickness ratio w/t and the slope of the frequency-temperature curve at room temperature of the rectangular AT-cut quartz resonator when l/t=15.25 and $\theta = 34°43'$, whose abscissa is the width-to-thickness ratio w/t and whose ordinate is the slope of the frequency-temperature curve at room temperature $(\partial/\partial T)(\Delta f/f)$.

A curve 2A shows the correlation between the slope and w/t when the major surface (X-Z' planes) and the side surfaces (X-Y' planes) meet substantially at right angles, i.e., $\alpha$ in FIG. 14 is substantially 0°. The data shows the slope of the frequency-temperature curves at room temperature investigating the frequency-temperature characteristics of the major vibration versus the width-to-thickness ratios w/t of the quartz crystal plate varied from w/t=3.3 by reducing the width w by grinding the side surface of the quartz crystal plate.

Curves 2B, 2C and 2D show the correlation between the slopes and w/t when the side surfaces of the quartz crystal plate, that is the X-Y' planes thereof being tilted by 6°27' clockwise, 6°27' counter-clockwise and 10°40' counter-clockwise around the X-axis directed perpendicular to the paper and upwardly. The data shows the slope of the frequency-temperature curves at room temperature investigating the frequency-temperature characteristics of the major vibration versus the width-to-thickness ratios w/t of the quartz crystal plate varied from w/t=2.6 by reducing the width w by grinding the side surfaces of the quartz crystal plate.

The slopes of the curve 2A in FIG. 10 is exceedingly sharp when w/t is less than 2.0 and in the vicinity of 3.0. If the slopes of the frequency-temperature curve is sharp, the accuracy requirement of finishing of the width-to-thickness ratio w/t becomes severer and mass-production of the quartz crystal plate becomes more difficult. Namely the slopes of the frequency-temperature curve is comparatively easy when w/t is in the range of 2.0 to 2.8. When w/t is in the range of 2.0 to 2.8, the quartz crystal plate can be mass produced in view of the lower accuracy requirement of finishing. On the other hand, when the slopes of each of the curves 2B, 2C and 2D of the quartz crystal plate having tilting side surfaces, that is the X-Y' planes, by $\alpha°$ in FIG. 15 are compared with the curve 2A, the slope of the curve 2B is sharper than that of the curve 2A and the slopes of the curves 2C and 2D are easier than that of the curve 2A. Especially, since the slope of the curve 2C is exceedingly easy, the quartz crystal plate having the curve 2C is suitable for mass production in view of the lower accuracy requirement of finishing. If the side surfaces of the quartz crystal plate, that is the X-Y' planes, are tilted counter-clockwise by $\alpha°$ (in the range of 0° to 10°40') around the X-axis directed perpendicular to the paper and upwardly as shown in FIG. 14, the mass production of the quartz crystal plate is advantageous in view of the lower accuracy requirement of finishing and the yield of mass production is improved.

Quartz resonators having the width-to-thickness ratios w/t in the range of 2.0 to 2.8 are most suitable for use in electronic wrist watches, clocks and electronic devices mainly used at room temperature in consideration of the temperature of the inflection point. However, when the AT-cut quartz resonator having the temperature of the inflection point less than 5° C. is required for instance, the width-to-thickness ratio can be less than 2.0 if $\alpha$ in FIG. 14 is about 6°30'.

Figure 16:
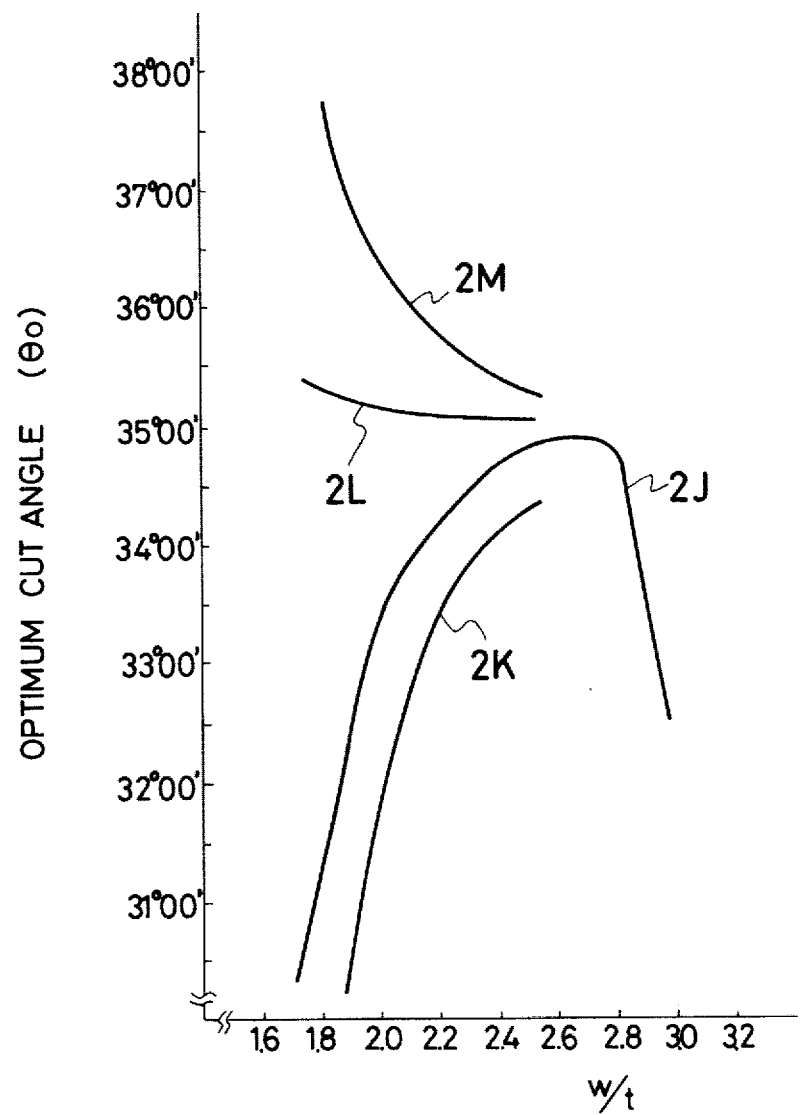
FIG. 16 is a correlation diagram between the optimum cut angle $\theta_0$ and the width-to-thickness ratios w/t of an AT-cut quartz resonator according to the present invention.

FIG. 16 is a correlation diagram between the optimum cut angle $\theta_0$ out of the cut angle $\theta$ shown in FIG. 1 to obtain the frequency-temperature characteristics shown in FIG. 4 and the width-to-thickness ratios w/t, whose abscissa is the width-to-thickness ratio w/t and whose ordinate is the optimum cut angle $\theta_0$ to obtain the frequency-temperature characteristics shown in FIG. 4. Curves 2J, 2K, 2L and 2M show the optimum cut angle $\theta_0$ versus the width-to-thickness ratio w/t of the quartz crystal plate that is the same as the quartz crystal plate showing the frequency temperature curves 2A, 2B, 2C and 2D in FIG. 15.

The optimum cut angle $\theta_0$ of the thin AT-cut quartz resonator, the major surfaces (X-Z' planes) and the side surfaces (X-Y' planes) of which meet at substantially right angles, i.e., $\alpha$ in FIG. 14 is substantially 0°, is substantially 33°20' when w/t=2.0 and 34°55' when w/t=2.0 according to the curve K in FIG. 16. From the correlation diagram in FIG. 16, the optimum cut angle $\theta_0$ is chosen in the range of substantially 33°20' to 34°55' corresponding to each of the values of w/t when the width-to-thickness ratio w/t is in the range of 2.0 to 2.8.

On the other hand, if the angle $\alpha$ is in the range of 0° to 10°40' around the X-axis counter-clockwise directed perpendicular to the paper and upwardly, the range of variation of the optimum cut angle against the width-to-thickness ratio w/t is narrow and consequently the quartz resonator is suitable for mass production. Especially when $\alpha=6°27'$, the optimum cut angle $\theta_0$ is almost fixed even if the width-to-thickness ratio w/t disperses more or less when the quartz resonator is finished. If $\alpha$ is in the range of 0° to 10°40' around the X-axis counter-clockwise directed perpendicular to the paper and upwardly, the range of variation of the optimum cut angle $\theta_0$ is chosen in the range of substantially 33°20' to 36°20' corresponding to each of the values of w/t.

Figure 17A:
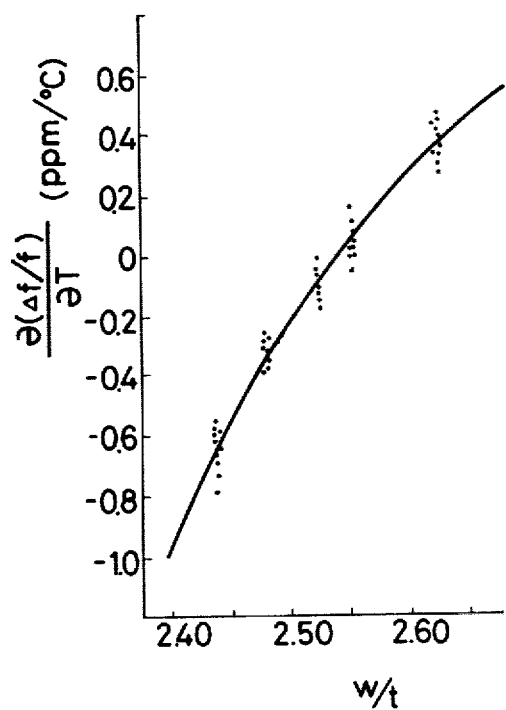
FIG. 17(a) is a correlation diagram between the slope of the frequency-temperature curve at room temperature and the width-to-thickness ratio w/t of a rectangular AT-cut quartz resonator embodying the present invention.

FIG. 17(a) shows the slope of the frequency-temperature curve at room temperature when the width-to-thickness ratio w/t of the the rectangular AT-cut quartz resonator, further restricting w/t and l/t according to an embodiment of the present invention is in the range of 2.41 to 2.66 when the angle $\alpha$, i.e., the angle between the major surfaces (X-Z' planes) and the side surfaces (X-Y' planes) in FIG. 14 is substantially a right angle and l/t=15.25 and $\theta=34°53'$.

Figure 17B:
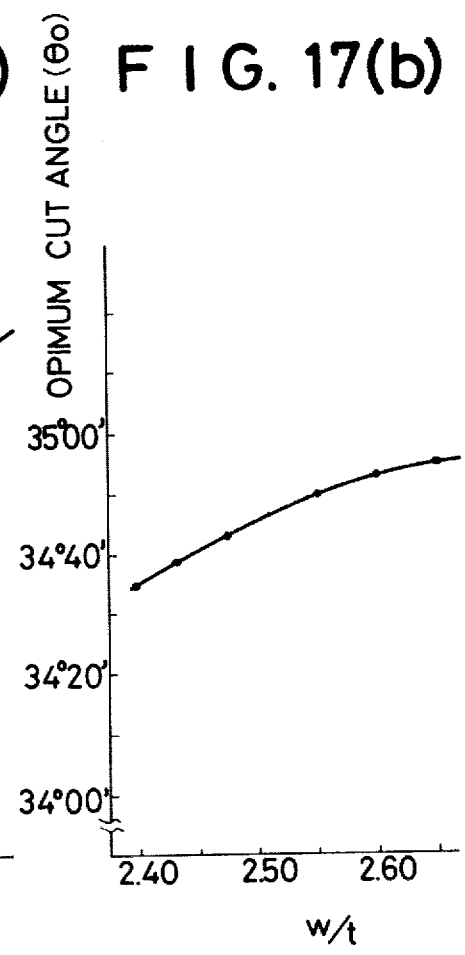
FIG. 17(b) is a correlation diagram between the optimum cut angle $\theta_0$ and the width-to-thickness ratio w/t of the rectangular AT-cut quartz resonator embodying the present invention.

FIG. 17(b) shows the correlation between the optimum cut angle $\theta_0$ showing the plain frequency-temperature characteristic at room temperature and the width-to-thickness ratio w/t of the rectangular AT-cut quartz resonator shown in FIG. 17(a).

As shown in FIG. 17(b), the rectangular AT-cut quartz resonator showing the plain frequency-temperature curve at room temperature according to the present invention is mass-produced by the easy processing method when $\theta_0$ is chosen in the range of 34°35' according to w/t. If the side surfaces of the quartz crystal plate, that is the X-Y' planes, are tilted at $\alpha$ degrees in the range of 0° to 10°40' counter-clockwise around the X-axis directed perpendicular to the paper and upwardly as shown in FIG. 14, the quartz crystal plate becomes mass producible and yield of mass production is improved. If the optimum cut angle $\theta_0$ is chosen in the range of 34°35' to 35°25' when the angle $\alpha$ rotating the quartz crystal plate counter-clockwise is in the range of 0° to 10°40' directing perpendicular to the paper and upwardly, the preferable frequency-temperature characteristics showing the plain curve at room temperature is realized over the width-to-thickness ratio w/t of the rectangular AT-cut quartz crystal resonator embodying the present invention in the range of 2.41 to 2.66.

Especially, in the case that $\alpha=6°27'$, the optimum cut angle $\theta_0$ doesn't change even if w/t disperses when the quartz resonator is finished.

FIG. 18 is a plan view of the rectangular AT-cut quartz resonator embodying the present invention showing the rotation angle $\phi$ between the length direction 1 of the quartz crystal plate 6 and the X-axis when the Y'-axis is the rotation axis, wherein 7 denotes an exciting electrode and 8, 8 denote bevelled portions.

Figures 19A, 19B:
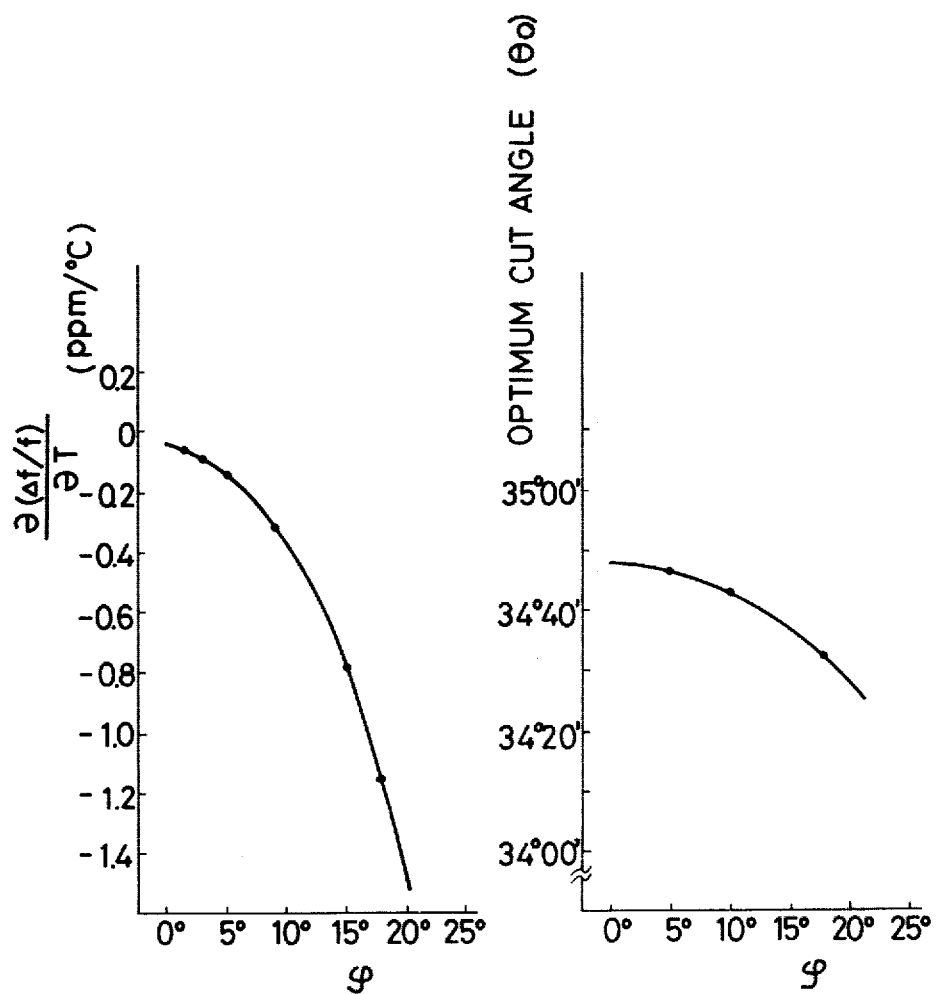
FIG. 19(a) is a correlation diagram between the slope of the frequency-temperature curve and the rotation angle $\phi$.
FIG. 19(b) is a correlation diagram between the optimum cut angle $\theta$ and the rotation angle $\phi$.

FIG. 19(a) is a correlation diagram between the slope of the frequency-temperature curve at room temperature and the rotation angle $\phi$ of the rectangular AT-cut quartz resonator shown in FIG. 2 embodying the present invention, changing the rotation angle when the width-to-thickness ratio w/t=2.5 and the length-to-thickness ratio l/t=15.25, whose abscissa is the rotation angle $\phi$ shown in FIG. 18 and whose ordinate is the slope of the frequency-temperature curve at room temperature $[\partial(\Delta f/f)]/\partial T$. The cut angle 0 in FIG. 19(a) is 34°48'.

FIG. 19(b) is the correlation diagram showing the optimum cut angle $\theta_0$ and the rotation angle $\phi$ to obtain the plain frequency-temperature curve at room temperature. As shown in FIGS. 19(a) and 19(b), the slope of the frequency-temperature curve becomes sharper when the rotation angle is more than 18° and the tolerance requirement of finishing becomes severer.

In the case of the AT-cut quartz resonator according to the present invention, the tolerance of finishing is not sever if the length direction of the quartz crystal is substantially in the direction of the X-axis, i.e., in the range of $\pm 18°$ from the X-axis when the Y'-axis is the rotation axis. The optimum cut angle $\theta_0$ is chosen by the rotation angle $\phi$. Though the spurious vibration frequency varies more or less by the rotation angle $\phi$, the dimensional region according to the present invention shown in FIG. 13 doesn't vary if $\phi=0°\pm 18°$. The AT-cut quartz resonator having both its end portions in the length direction of the quartz crystal plate bevelled as has been illustrated so far and the bevel length l and the thickness of the end portions of the rectangular AT-cut resonator embodying the present invention including the length-to-thickness ratio l/t and the width-to-thickness ratio w/t of the resonator in the region of the quadrangle ABCD shown in FIG. 13 shows the frequency-temperature characteristics of the plain cubic curve at room temperature peculiar to the AT-cut quartz resonator not injuriously effected by the spurious vibrations as long as $l_0/l$ and $t_0/t$ satisfy the following equations: $0.08 \leq l_0/l \leq 0.32$, $0.15 \leq t_0/t \leq 0.85$. The important factor of the equation is the width-to-thickness ratio w/t and the length-to-thickness ratio l/t, and thereby the end portions of the quartz resonator so finished as to have a plano-convex shape or a plano-bevel shape can also satisfy the above mentioned quadrangle ABCD. The end portions of the quartz resonator in the direction of the X-axis so finished as to have a bevel shape or a convex shape is effective to maintain the high Q-value since the decline of Q-value is decreased in case the resonator is supported at the end portions in the length direction.

Figure 20:
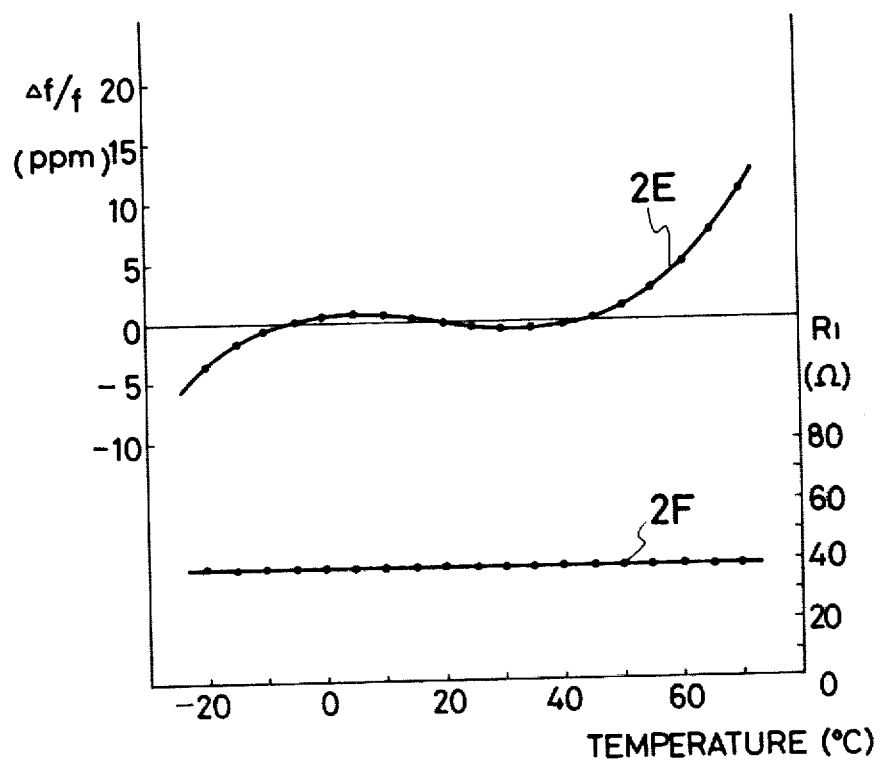
FIG. 20 shows a temperature curve of a rectangular AT-cut quartz resonator embodying the present invention.

FIG. 20 illustrates the temperature curves of the rectangular AT-cut quartz resonator embodying the present invention. Curves 2E and 2F respectively denote the frequency-temperature curve and the temperature curve of the equivalent series resistance. The temperature curves shown in FIG. 20 is of the sample of $\theta=34°48'$, l/t=15.3, w/t=2.52 and $\alpha=0°$. In the dimensional region according to the present invention where the width-shear vibration frequency and the flexural vibration frequency of high response and the spurious vibration frequency of low response differ from the main vibration frequency, the preferable frequency-temperature curve and the plain temperature curve of the equivalent series resistance as shown in FIG. 15 are realized. The temperature of the inflection point of the temperature curve in FIG. 15 is about 20° C. In the case that the thickness and the major vibration frequency are respectively substantially 0.4 mm and 4 MHz, the rectangular AT-cut quartz resonator of exceedingly miniature size of about 1 mm in thickness and 6.1 mm in length is realized.

According to the present invention, by choosing the width-to-thickness ratio w/t of the quartz crystal plate in the range of 2.0 to 2.8, a thin AT-cut quartz crystal resonator of miniature size, having high Q-values, low equivalent series resistance and temperature of the inflection point of the frequency-temperature curve in the range of 5° C. to 35° C. is realized. Further, by restricting the dimensional ratios w/t and l/t within a quadrangule defined by four points A, B, C and D having certain values, the rectangular AT-cut quartz resonator of miniature size which is not injuriously effected by spurious vibrations and having the temperature of the inflection point of the frequency-temperature curve at about 20° C. and mass producible in view of the accuracy of finishing can be provided. Consequently the primary object of the present invention is fully achieved.

We claim:

1. A quartz resonator comprising: an AT-cut quartz crystal plate rotated counter-clockwise around the X-axis of the quartz crystal plate by a cut angle θ having a value from about 33°20′ to about 36°20′, having an overall length l, an overall width w and a maximum thickness t respectively extending along the X-axis, the Z′-axis and the Y′-axis of the quartz crystal plate, a width-to-thickness ratio w/t between about 2.0 to about 2.8 and a length-to-thickness ratio l/t less than about 25.

2. An AT-cut quartz resonator as claimed in claim 1, wherein the X-Y′ plane of the quartz crystal plate is almost rectangular in plan.

3. An AT-cut quartz resonator as claimed in claim 1, wherein major surfaces parallel to the X-Z′ plane and side surfaces parallel to the X-Y′ plane of the quartz crystal plate meet substantially at right angles.

4. An AT-cut quartz resonator as claimed in claim 1, wherein the thickness of the end portions along the length of a quartz crystal plate are thinner than the thickness of the major vibrating portion of the quartz crystal plate between the plate end portions.

5. An AT-cut quartz resonator as claimed in claim 1, wherein the side surface parallel to the X-Y′ plane of the quartz crystal plate are rotated around the X-axis counter-clockwise by an angle α between about 0° to about 10°40′.

6. An AT-cut quartz resonator as claimed in claim 3, wherein the cut angle θ is within the range of about 33.20′ to about 34°55′.

7. An AT-cut quartz resonator as claimed in claim 2, wherein the length l, the width w and the thickness t of the quartz crystal plate are respectively chosen in the directions of the X-axis, Z′-axis and the Y′-axis and the dimensional ratios w/t, l/t when indicated on a graph whose abscissa is w/t and whose ordinate is l/t are within a quadrangle defined by four points A, B, C, D having w/t and l/t coordinates A(2.41, 15.69), B(2.58, 15.56), C(2.66, 14.98) and D(2.41, 14.98).

8. An AT-cut quartz resonator as claimed in claim 7, wherein major surfaces parallel to the X-Z′ plane and side surfaces parallel to the X-Y′ plane of the quartz crystal plate meets substantially at right angles and the cut angle θ is within the range of about 34°35′ to about 34°55′.

9. A rectangular AT-cut quartz resonator as claimed in claim 7, wherein the side surfaces of the quartz crystal plate parallel to the X-Y′ planes are tilted counter-clockwise by an angle α withing the range of about 0° to about 10°40′ and the cut angle θ is within the range of about 34°35′ to about 35°25′.

* * * * *